US012632086B2

(12) United States Patent
Wang et al.

(10) Patent No.: US 12,632,086 B2
(45) Date of Patent: May 19, 2026

(54) ADAPTER FOR A HANDLE ATTACHMENT FOR A MOBILE COMPUTING DEVICE

(71) Applicant: ZEBRA TECHNOLOGIES CORPORATION, Lincolnshire, IL (US)

(72) Inventors: Chieh Kai Wang, Taichung City (TW); Huang Chih Huang, Taoyuan City (TW); Chi-Ming Wang, Taipei (TW); Li-Ko Wang, New Taipei City (TW); Yun Sheng Chou, New Taipei City (TW)

(73) Assignee: Zebra Technologies Corporation, Lincolnshire, IL (US)

( * ) Notice: Subject to any disclaimer, the term of this patent is extended or adjusted under 35 U.S.C. 154(b) by 289 days.

(21) Appl. No.: 18/203,850

(22) Filed: May 31, 2023

(65) Prior Publication Data

US 2024/0407115 A1     Dec. 5, 2024

(51) Int. Cl.
*G06F 1/16*          (2006.01)
*H05K 5/02*          (2006.01)

(52) U.S. Cl.
CPC .......... *G06F 1/1632* (2013.01); *G06F 1/1628* (2013.01); *H05K 5/023* (2013.01)

(58) Field of Classification Search
CPC ...... G06F 1/1632; G06F 1/1628; H05K 5/023
See application file for complete search history.

(56) References Cited

U.S. PATENT DOCUMENTS

| | | | | |
|---|---|---|---|---|
| 11,436,425 B2 * | 9/2022 | Miller | ................... | G06F 1/1698 |
| 2015/0241919 A1 * | 8/2015 | Beatty | ................... | G06F 1/1632 |
| | | | | 361/679.44 |
| 2019/0014890 A1 * | 1/2019 | Li | ............................ | A45F 5/00 |
| 2020/0379509 A1 * | 12/2020 | Coward | ................... | A47F 9/04 |
| 2022/0366164 A1 * | 11/2022 | DeGiovine | .......... | G06F 1/1626 |

FOREIGN PATENT DOCUMENTS

| | | | | | |
|---|---|---|---|---|---|
| KR | 20070062402 A | * | 6/2007 | .............. | H04M 1/04 |

* cited by examiner

*Primary Examiner* — Nidhi Thaker

(57)          ABSTRACT

An adapter is disclosed herein. The adapter comprises a base, at least one retention element, a biased latch, a handle, and a switch. The base has a first surface and a second surface opposite the first surface. The first base surface is configured to receive a first surface of a mobile computing device. The at least one retention element is positioned on a front end of the base and is configured to receive a first end of the mobile computing device. The biased latch is positioned on a rear end of the base and is adapted to attach a second end of the mobile computing device. The handle is positioned on the second base surface and the switch is positioned on the second base surface adjacent to the handle. The switch is mechanically linked to the biased latch, and the biased latch is configured to release the mobile computing device from the base when the switch is actuated.

15 Claims, 6 Drawing Sheets

<u>100</u>

ADAPTER FOR A HANDLE ATTACHMENT FOR A MOBILE COMPUTING DEVICE

BACKGROUND OF THE INVENTION

Mobile computing devices can be employed in a wide variety of environments. In some environments, such as transport and logistics facilities, mobile computing devices can be deployed as barcode readers. To facilitate the use of a mobile computing device as a barcode reader, the mobile computing device may be affixed to an accessory having a handle equipped with a trigger to activate a barcode reader module of the device.

SUMMARY

In an embodiment, the present disclosure is an adapter comprising: a base having a first surface and a second surface, the first base surface configured to receive a first surface of a mobile computing device and the second base surface being opposite the first surface; at least one retention element positioned on a front end of the base, the retention element configured to receive a first end of the mobile computing device; a biased latch positioned on a rear end of the base, the biased latch adapted to attach a second end of the mobile computing device, the second end being opposite the first end; a handle coupled to the second base surface; and a switch positioned on the second base surface adjacent to the handle, wherein the switch is mechanically linked to the biased latch, and the biased latch is configured to release the mobile computing device from the base when the switch is actuated.

In another embodiment, the present disclosure supports a handle adapter comprising: a base; a handle having a trigger, the handle secured to an underside of the base; a biased latch positioned on an end of the base; and a switch adjacent to the handle, the switch being positioned within an engagement distance from the handle.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 1:
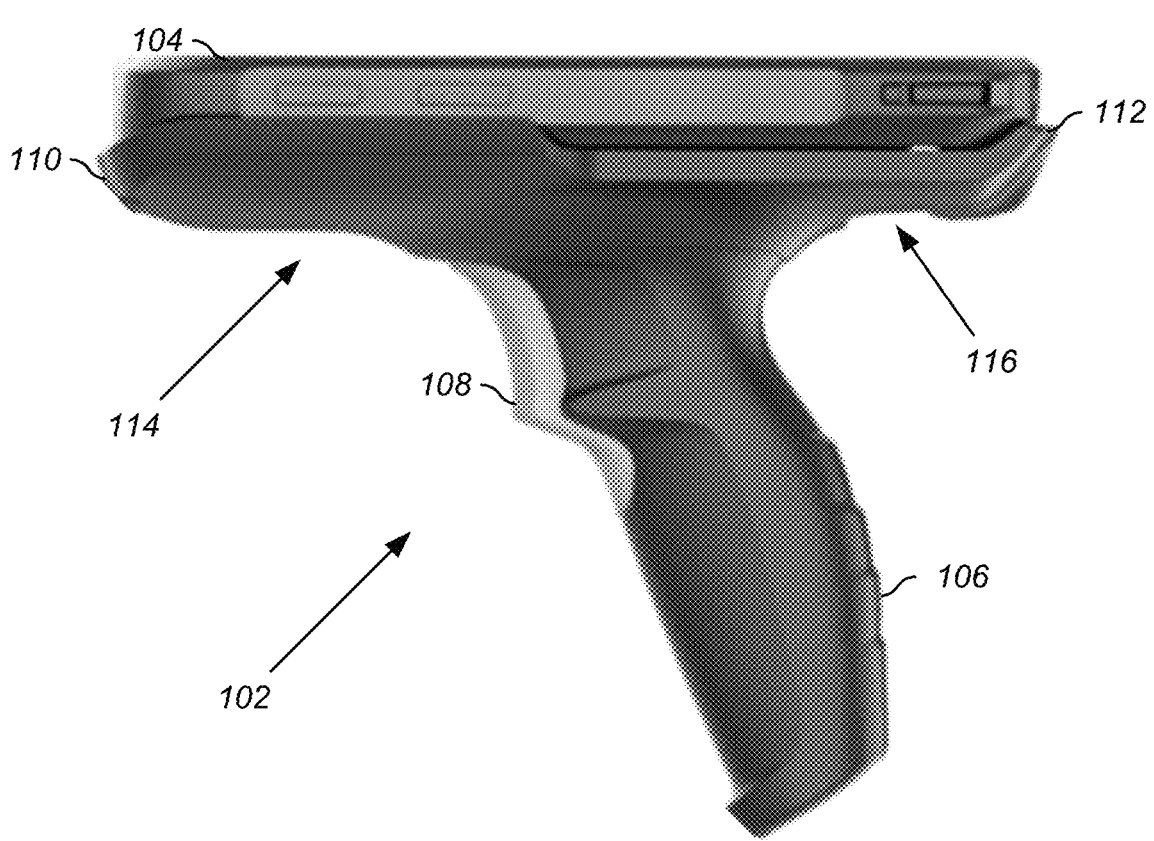
FIG. 1 illustrates a handle adapter with an attached mobile computing device according to an embodiment of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

The disclosed embodiments will be described more fully hereinafter with reference to the accompanying drawings, in which some, but not all embodiments of the disclosure are shown. Indeed, the disclosure may be embodied in many different forms and should not be construed as limited to the embodiments set forth herein; rather, these embodiments are provided so that this disclosure will satisfy applicable legal requirements. Like numbers refer to like elements throughout.

As mentioned above, in some environments, such as transport and logistics facilities, mobile computing devices (MCD) or devices, can be deployed as barcode readers. To facilitate the use of a mobile computing device as a barcode reader, the mobile computing device may be affixed to an accessory having a handle equipped with a trigger to activate a barcode reader module of the device. An MCD may be configured to capture data via a scan window of the MCD. A user can hold the MCD at any orientation, however, in embodiments where the scan window is positioned on a top of the MCD, the MCD should be parallel to the ground to provide for scanning via the scan window. By mounting a handle adapter to a rear surface of the MCD, the user can hold the MCD parallel to the ground to facilitate scanning.

FIG. 1 illustrates a side view of a handle adapter 102 secured to an MCD 104 in a scanner configuration 100. As shown, when in the scanner configuration 100, the handle adapter 102 can facilitate data capture via the MCD 104. As will be described in further detail below, the MCD 104 can be attached to the handle adapter 102 via a biased latch 112 proximate to a rear of the handle adapter 102. The biased latch 112 attaches the MCD 104 to the handle adapter 102 via a receiving portion of the MCD 104 and is configured to retain the MCD 104 within the handle adapter 102. Actuation of a switch 116 on a bottom of the handle adapter 102 can release the MCD from the handle adapter 102.

The handle adapter 102 comprises a handle portion 106 (handle) and a base portion 114 (base). In an embodiment, the handle adapter 102 can be a single and uniform molded structure (egg, the base 114 and the handle can be a uniformly molded structure of any suitable material such as plastic). In another embodiment, the handle is modular and is secured to an underside surface of the base 114.

As shown in FIG. 1, the handle 106 includes a trigger 108. The trigger 108 is in communication with the MCD 104. For example, when the MCD 104 is attached to the handle adapter 102, a user can actuate the trigger 108 to cause the MCD 104 to initiate a scanning event. A scanning event can include, but is not limited to, capturing data via a scan window of the MCD 104 (e.g., barcode scanning/imaging, image capture, etc.) or capturing radio frequency identification (RFID) data (e.g., an RFID tag) via an RFID reader (e.g., an antenna) of the MCD 104. For possible RFID data reading, the MCD 104 and the handle adapter 102 needs to be configured with antenna technology to best read the data.

Figure 2:
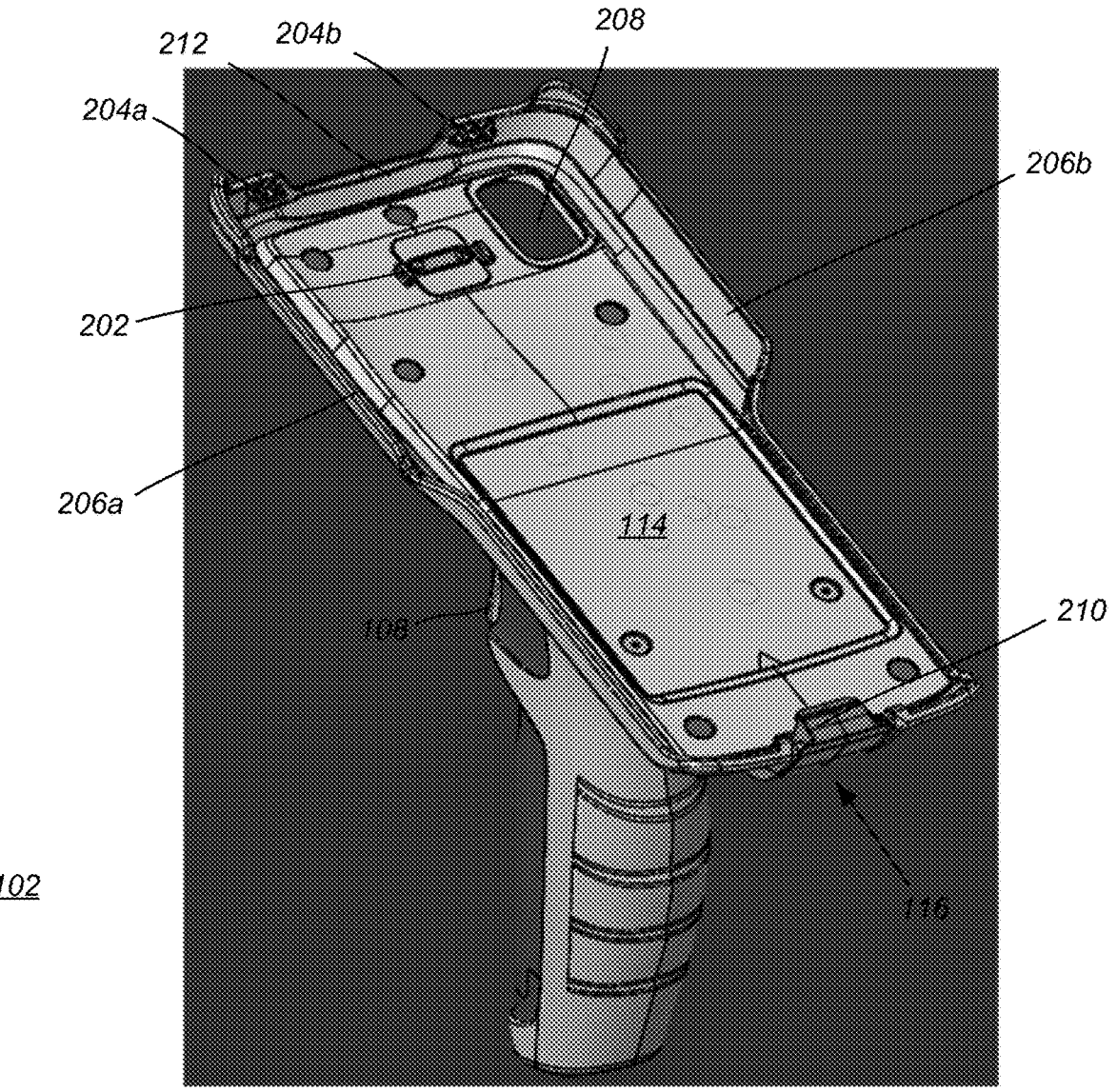
FIG. 2 illustrates an isometric view of the handle adapter of FIG. 1 with the mobile computing device removed according to an embodiment of the present disclosure.

FIG. 2 illustrates the handle adapter 102 of FIG. 1 with the MCD 104 removed. As shown in FIG. 2, the base 114 features an electrical connector 202 in the form of I/O pins. The electrical connector may be any type of connector that provides for electrical communication between the handle adapter 102 and the MCD 104. In an embodiment, the base 114 can communicate with the MCD 104 via wireless communication technology (e.g., Bluetooth or Near-Field Communication (NFC)). The base 114 has a first surface wall 206*a* and a second surface wall 206*b* that each extend substantially vertically from at least a portion of the base 114. The base 114 further side walls 206 that partially encircle the base 114.

FIG. 2 further illustrates retaining elements 204 featured on a front perimeter wall 212 of the base 114. The front perimeter wall 212 includes retaining elements 212. In one embodiment, the retaining element 212 is two protrusions 204*a*/204*b*. The two protrusions 204 are configured to insert into receiving areas located on the top of the MCD 104. The protrusions 204 may be shaped in a variety of configurations so long as the protrusions 204 align with the receiving areas of the MCD 104. The protrusions 204 will be described further below.

The base 114 further includes an aperture 208. The aperture 208 is located in the surface of the base 114 such that a field-of-view of a data capture element (e.g. camera) of the MCD 104 is directed through the aperture 208. This allows for the MCD 104 to use continue to use the camera when installed in the adapter 102.

The base 114 includes a latch 210 positioned near the rear of the base 114. The latch 210 is configured to secure to the MCD 104 to the adapter 102. The latch 210 is actuated by a switch on the underside of the base 114, the relationship between the latch 210 and the switch will be discussed in further detail below.

Figure 3:
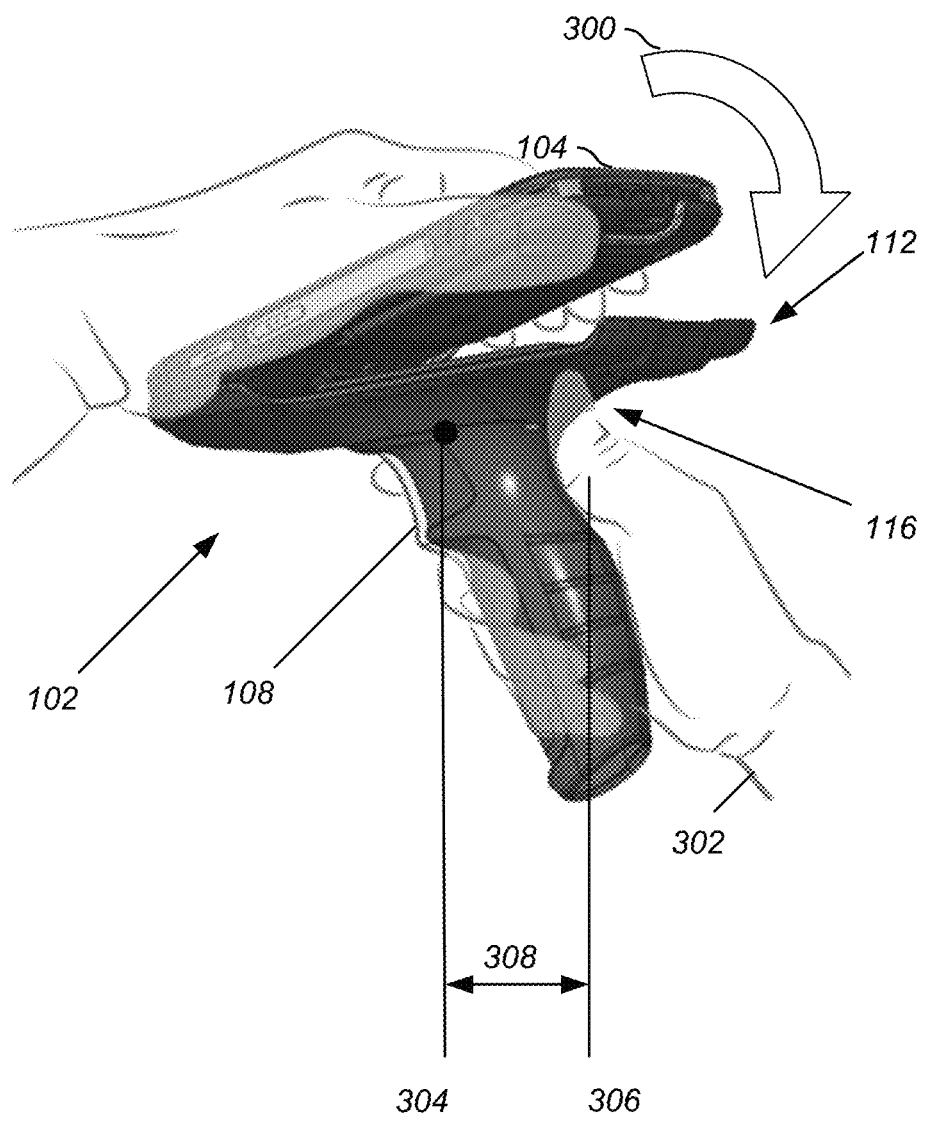
FIG. 3 illustrates the handle adapter of FIG. 1 with a mobile computing device being attached according to an embodiment of the present disclosure.

As illustrated in FIG. 3, the MCD 104 is installed top first into the adapter 102 such that the receiving areas of the MCD 104 mesh with the protrusions 204 of the adapter 102. Once the MCD 104 pairs with the protrusions 204, the MCD 104 can rotate until the bottom of the MCD 104 interacts with the latch of the adapter 102. The MCD 104 rotates in the direction 300 until latched. Once latched, the MCD 104 is secured to the adapter 102 and is retained until unlatched.

As depicted in FIG. 3, while the MCD 104 is being secured within the adapter 102, a user hand 302 acts to grip the handle 106. FIG. 3 depicts the handle 106 having a central point indicated by point 304. The central point 304 is positioned on the underside of the base 114 and in the middle of the connection area where the handle 106 is secured to the base 114. The distance between the central point 304 and the switch location 306 is an engagement distance 308. The engagement distance 308 is such that a user can be gripping the handle 106 with their fingers and without releasing their grip, may actuate the switch 116 with their thumb. In an embodiment, the engagement distance 308 is 1 to 3 inches. In an embodiment it may be 2 to 4 inches.

Returning to FIG. 2, when the MCD 104 is attached to the adapter 102, a top scan window of the MCD 104 aligns with a lower lip wall 212 of the adapter 102. The lower lip wall 212 is positioned between two protrusions 204 of the MCD 104. In an embodiment, the protrusions 204 may be differently arranged around the scan window for securing the top of the MCD 104 to the adapter 102.

The disclosure herein allows for a latching system for the adapter 102. When a MCD 104 is installed into the adapter 102, the biased latch 210 flexes away from the MCD 104 to receive the MCD 104 and secures the MCD 104 to the adapter 102. The switch 116 located on the opposite side of the base 114 (per the perspective in FIG. 2) actuates inner mechanism of the adapter 102 to pivot the biased latch 210 away from the MCD 104 to release the MCD 104 from the adapter 102 (described in further detail below).

Figure 4:
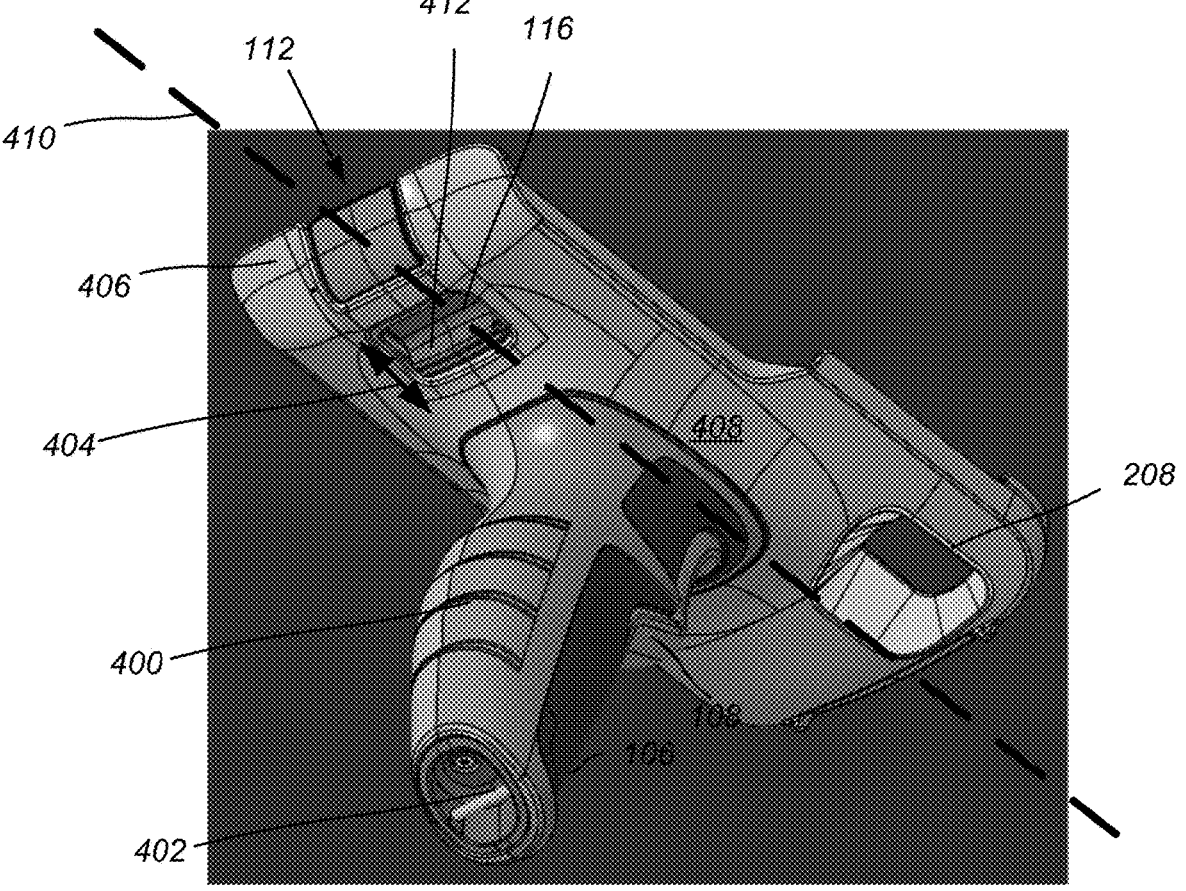
FIG. 4 illustrates another isometric view of the handle adapter of FIG. 2 according to an embodiment of the present disclosure.

As illustrated in FIG. 4, the switch 116 is disposed on an underside 408 of the base 114. The switch 116 is configured to release the MCD 104 when actuated. The switch 116 is positioned such that a user may activate the switch 116 with a thumb of the same hand in which the user is holding the adapter. In an embodiment, the user may actuate the switch 116 with a different hand. The switch 116 may be activated by translating the switch 116 in a plane parallel to the base 114. In other words, the switch 116 may be activated by sliding the switch 116 along the underside of the base 114.

As illustrated in FIG. 4, handle 106 has a rear handle element 400. In an embodiment, the user's hand grips the handle 106 with the rear handle element 400 facing the user such that the user can either pull the trigger 108 or activate the switch 116. The handle 106 has a first end that abuts the underside 408 of the base 114 and a second end 402. In the depicted embodiment, the second end 402 of the handle 106 includes a means to connect a clip, lanyard, or a holding device of some kind.

Figure 5A:
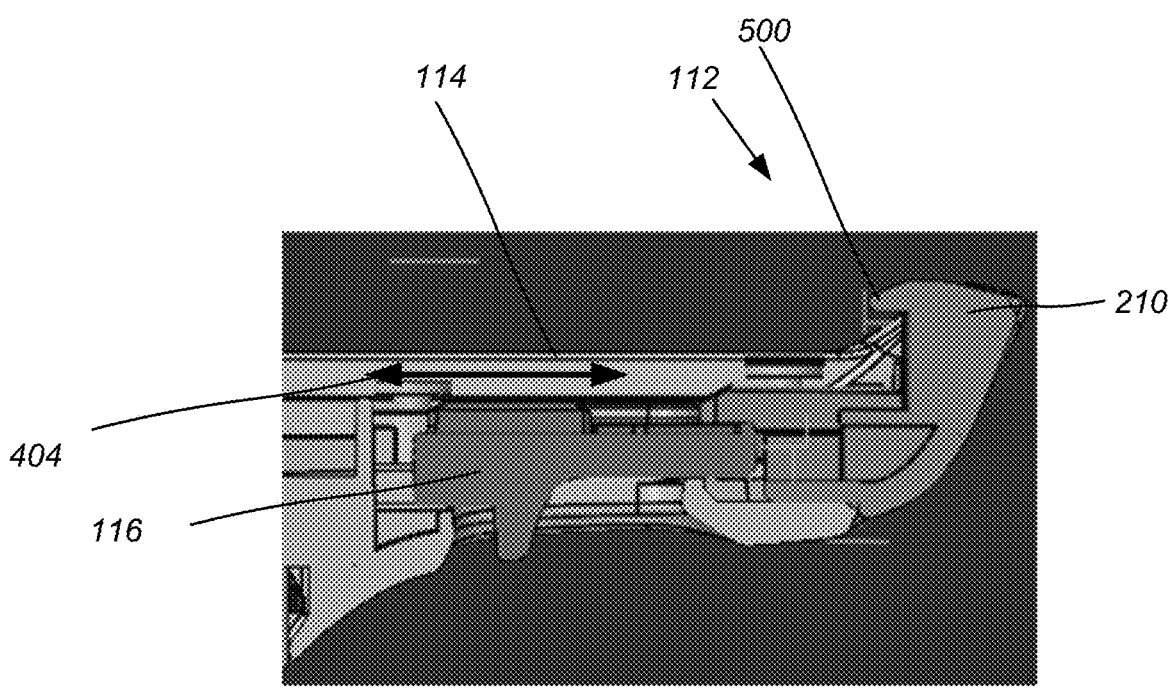
FIG. 5A illustrates a side cross section view of the handle adapter of FIG. 2 according to an embodiment of the present disclosure.

FIG. 5A illustrates a cross-section along the dotted line 410 of the embodiment depicted in FIG. 4. an underside perspective of the adapter embodiment as shown in FIG. 2.

FIG. 5A depicts the switch 116 supported within the base 114, the switch 116 positioned adjacent to the biased latch 210. While the switch 116 and the biased latch 210 are shown adjacent to each other in FIG. 5A, the switch 116 and the biased latch 210 may be spaced apart as long as a linkage exists which will be described below.

As illustrated in FIG. 5A, the biased latch 210 includes a tab 500. The tab 500 is configured to retain the MCD 104 when the MCD 104 is installed on to the adapter 102.

Figure 5B:
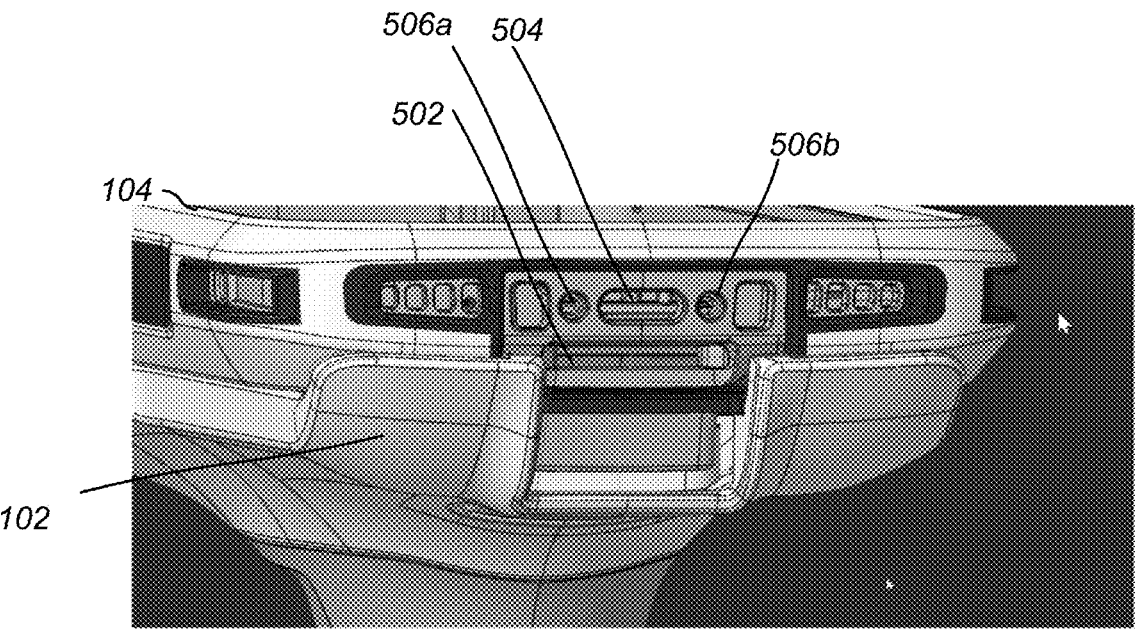
FIG. 5B illustrates a rear perspective of the handle adapter and mobile computing device with a latch removed according to an embodiment of the present disclosure.

FIG. 5B illustrates the MCD 104 installed into the adapter 102 with the biased latch 210 not shown. The MCD 104 includes a recess 502 configured to receive the tab 500 when installed. While the depicted embodiment shows a mating tab 500 and recess 502, it is understood that any type of mating configurations may be used that would allow the biased latch 210 to releasably secure the MCD 104 to the adapter 102. As illustrated in FIG. 5B, when latching, the tab 500 translates into the recess 502 by moving in a direction into the FIG. 5B as depicted.

As illustrated in FIG. 5B, the MCD 104 includes a charging port 504. The charging port 504 is configured to receive a wired connection that would allow for data transfer, power charging, or any other combination thereof. The biased latch 210, when securing the MCD 104, inserts into the recess 502 without covering the charging port 504, allowing the port to continue to receive data or power while secured into the adapter. The MCD 104 may further include additional charging pads 506*a*/506*b* that are unblocked by the latch 210 during securement.

Figure 6:
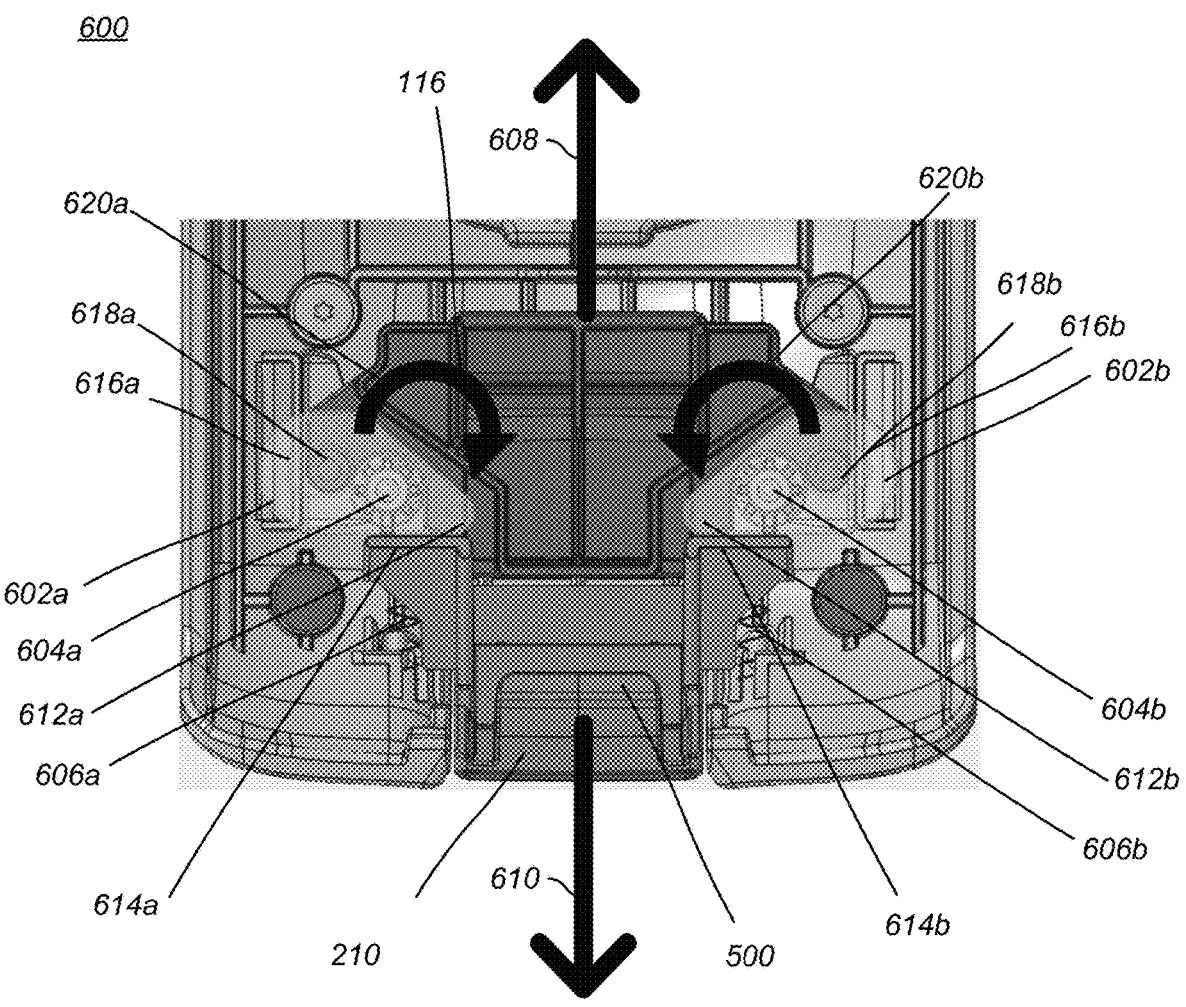
FIG. 6 illustrates a view of a linkage positioned within the handle adapter according to an embodiment of the present disclosure.

FIG. 6 illustrates the linkage 600 between the switch 116 and the biased latch 210 and tab 500 and illustrates how the actuation of the switch 116 relates to the disengagement of tab 500. FIG. 6 depicts internal components of the adapter 102 with a top cover removed. The linkage 600 begins with the actuation of the switch 116 in a linear matter away from the biased latch 210.

When the switch 116 is moved in a first direction 608 towards the front of the adapter 102, the biased latch 210 is translated in a second direction 610 towards the. In the depicted embodiment, the first direction 608 and the second direction 610 are opposite. In an embodiment, dependent upon the types of switches 116 used, the first direction of the actuation of the switch 116 might be different.

When the switch 116 is moved in the first direction 608, cams 602a/602b rotate inwardly and drive the biased latch 210 away. When the switch 116 is actuated, first cam 602a rotates about a first shaft 604a in a clockwise direction and second cam 602b rotates about a second shaft 604b in a counter-clockwise direction. The first and second shafts 604 are secured to the base 114. The cams 602 contact the biased latch 210 via a first contact end 612a and a second contact end 612b respectively. The first and second contact end 612 of the cams 602 are configured to contact a first and second drive surface 614 of the biased latch 210. The contact between the contact ends 612 and the drive surfaces 614 cause the biased latch 210 to translate.

The first and second cam 602 include a first and second slot 616a/616b (slots 616 collectively). As depicted in FIG. 6, the slot 616 is disposed within the cam body such that the slots 616 receive protrusions 618a/618b. The protrusions 618 are part of the switch 116 such that when the switch 116 moves, the protrusions move. As depicted in FIG. 6, when the switch 116 moves in the direction 608, the protrusions 618 move along with the switch 116. When the protrusions 618 move with the switch 116 in the direction of arrow 608, the protrusions 618 move the slot 616 with the movement, this causes the protrusion 618 to slide from one end of the slot 616 to the other side of slot 616. As the protrusion 618 moves, the contact between the protrusion and the edge of the slot causes the cam 602 to rotate around the shaft 604. In other words, as depicted in FIG. 6, as the switch 116 and the protrusions 618a/b move in the direction of arrow 608, the first and second cam are rotated in the direction of arrows 620a and 620b respectively.

When the biased latch 210 is forced in the second direction 610, the biased latch 210 pushes against bias elements 606. In the depicted embodiment, the bias elements are compression springs, however it is appreciated that the bias elements may be any type of element capable of providing a force in the first direction 608 against the biased latch 210. The bias elements 606 are positioned between the base of the adapter 102 and the bias latch 210. The bias elements 606 are configured to provide a force such that when the user releases switch 116, the bias elements 606 provide a force against the biased latch 210 and the biased latch 210 translates in the first direction 608.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

Certain expressions may be employed herein to list combinations of elements. Examples of such expressions include: "at least one of A, B, and C"; "one or more of A, B, and C"; "at least one of A, B, or C"; "one or more of A, B, or C". Unless expressly indicated otherwise, the above expressions encompass any combination of A and/or B and/or C.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

That which is claimed:

1. An adapter comprising: a base having a first base surface and a second base surface, the first base surface configured to receive a first surface of a mobile computing device and the second base surface being opposite the first surface; at least one retention element positioned on a front end of the base, the retention element configured to receive a first end of the mobile computing device; a biased latch positioned on a rear end of the base, the biased latch adapted to attach a second end of the mobile computing device, the second end being opposite the first end; a handle coupled to the second base surface; and a switch positioned on the second base surface adjacent to the handle, wherein the switch is mechanically linked to the biased latch, and the biased latch is configured to release the mobile computing device from the base when the switch is actuated, wherein, during actuation of the switch, the switch translates in a first direction toward an aperture in the base and the biased latch translates in a second direction opposite the first direction and away from the aperture in the base, wherein a field-of-view of a data capture element of the mobile computing device is directed through the aperture.

2. The adapter of claim 1, wherein the first direction is towards the front end of the base.

3. The adapter of claim 1, wherein the handle comprises a trigger and the trigger is in electrical communication with the mobile computing device.

4. The adapter of claim 1, wherein the handle and the switch are separated by an engagement distance.

5. The adapter of claim 1, wherein at least one cam rotates to push the biased latch laterally away from the switch when the switch is actuated.

6. The adapter of claim 1, wherein a charging port of the mobile computing device is accessible when the biased latch attaches to the second end of the mobile computing device.

7. The adapter of claim 1, further comprising a radio frequency identification (RFID) reader operable by the mobile computing device when the mobile computing device is attached to the base.

8. A handle adapter comprising: a base; a handle having a trigger, the handle secured to an underside of the base; a biased latch positioned on an end of the base; and a switch adjacent to the handle, the switch being positioned within an engagement distance from the handle, wherein, during actuation of the switch, the switch translates in a first direction toward an aperture in the base and the biased latch translates in a second direction opposite the first direction and away from the aperture in the base, and wherein a field-of-view of a data capture element of a mobile computing device is directed through the aperture.

9. The handle adapter of claim 8, wherein the base comprises a retention element configured to mesh with a device.

10. The handle adapter of claim 8, wherein the handle adapter is configured to receive the mobile computing device.

11. The handle adapter of claim 10, wherein the trigger on the handle is in electric communication with the mobile computing device.

12. The handle adapter of claim 10, wherein when the biased latch is secured into an end of the mobile computing device, a charging port for the mobile computing device is accessible.

13. The handle adapter of claim 8, wherein the engagement distance is between 1-3 inches.

14. The handle adapter of claim 8, wherein, when the switch is actuated, at least one cam rotates to push the biased latch laterally away from the switch.

15. The handle adapter of claim 8, further comprising a radio frequency identification (RFID) reader operable by the mobile computing device when the mobile computing device is secured.

* * * * *